United States Patent
Erturk et al.

(10) Patent No.: US 10,470,309 B2
(45) Date of Patent: Nov. 5, 2019

(54) INDUCTOR AND CAPACITOR INTEGRATED ON A SUBSTRATE

(71) Applicant: QUALCOMM Incorporated, San Diego, CA (US)

(72) Inventors: Mete Erturk, San Diego, CA (US); Farsheed Mahmoudi, San Diego, CA (US); James Thomas Doyle, Carlsbad, CA (US); Ravindra Vaman Shenoy, Dublin, CA (US); Jitae Kim, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 238 days.

(21) Appl. No.: 14/859,320

(22) Filed: Sep. 20, 2015

(65) Prior Publication Data

US 2017/0086295 A1  Mar. 23, 2017

(51) Int. Cl.
| | | |
|---|---|---|
| H05K 1/16 | (2006.01) | |
| H01L 27/01 | (2006.01) | |
| H01L 23/522 | (2006.01) | |
| H01L 49/02 | (2006.01) | |
| H01L 23/498 | (2006.01) | |
| H05K 1/11 | (2006.01) | |
| H05K 3/42 | (2006.01) | |

(52) U.S. Cl.
CPC ....... *H05K 1/162* (2013.01); *H01L 23/49822* (2013.01); *H01L 23/5222* (2013.01); *H01L 23/5227* (2013.01); *H01L 27/016* (2013.01); *H01L 28/10* (2013.01); *H01L 28/40* (2013.01); *H05K 1/165* (2013.01); *H05K 1/115* (2013.01); *H05K 3/426* (2013.01); *H05K 2201/086* (2013.01)

(58) Field of Classification Search
CPC ........ H05K 1/162; H05K 1/165; H05K 3/426; H05K 1/115; H05K 2201/086; H01L 27/01
See application file for complete search history.

(56) References Cited

U.S. PATENT DOCUMENTS

| | | | |
|---|---|---|---|
| 9,412,734 B2* | 8/2016 | Zhou | H01L 28/10 |
| 2005/0073818 A1* | 4/2005 | Hirano | H01G 4/40 |
| | | | 361/763 |
| 2006/0128036 A1* | 6/2006 | Brennan | H01L 23/5223 |
| | | | 438/3 |
| 2008/0007253 A1* | 1/2008 | Takahata | G01D 5/2066 |
| | | | 324/207.22 |
| 2011/0285312 A1* | 11/2011 | Choutov | H05B 33/0815 |
| | | | 315/291 |
| 2013/0292808 A1* | 11/2013 | Yen | H01L 23/552 |
| | | | 257/660 |
| 2014/0104288 A1* | 4/2014 | Shenoy | G09G 5/00 |
| | | | 345/531 |
| 2014/0247269 A1* | 9/2014 | Berdy | H01F 1/24 |
| | | | 345/501 |

(Continued)

*Primary Examiner* — David M Sinclair
(74) *Attorney, Agent, or Firm* — Muncy, Geissler, Olds & Lowe (57) ABSTRACT

An integrated circuit device, such as a system-on-a-chip (SOC) device that includes an integrated or embedded voltage regulator, comprises an integrated capacitor and an integrated inductor having a magnetic core that can be fabricated in the same process as the capacitive structure of the integrated capacitor.

18 Claims, 6 Drawing Sheets

(56) References Cited

U.S. PATENT DOCUMENTS

| | | |
|---|---|---|
| 2014/0264732 A1 | 9/2014 | Elsherbini et al. |
| 2014/0268615 A1 | 9/2014 | Yun et al. |
| 2014/0347025 A1 | 11/2014 | Liao |
| 2015/0042438 A1 | 2/2015 | Liu et al. |
| 2015/0070863 A1 | 3/2015 | Yun et al. |
| 2015/0302974 A1* | 10/2015 | Zhao .................. H01F 17/0013 361/270 |
| 2016/0163693 A1* | 6/2016 | Zhou ...................... H01L 28/10 257/531 |

* cited by examiner

FIG. 8

# INDUCTOR AND CAPACITOR INTEGRATED ON A SUBSTRATE

FIELD OF DISCLOSURE

Various examples described herein relate to integrated circuit devices, and more particularly, to integrated circuit devices with voltage regulators.

BACKGROUND

Voltage regulators have been implemented in conventional dedicated power management integrated circuits (PMICs). A conventional PMIC, which is separate from other integrated circuits on a circuit board, may have difficulty meeting the droop (transient) and power (efficiency) requirements of a modern multi-core application processor or communication processor, for example.

There has been a growing interest in integrated voltage regulators implemented as part of system-on-a-chip (SOC) integrated circuit devices. Integrated voltage regulators, however, may present several challenges in chip design and layout. For example, passive components such as inductors and capacitors in voltage regulators may pose a design challenge, because passive components such as inductors and capacitors, especially those with large inductance and capacitance values, may have large form factors requiring large surface areas in SOC die layouts.

Moreover, a voltage regulator, such as an integrated switching voltage regulator, may require a high-capacitance-density and low-loss capacitor as well as a high-inductance-density and low-loss inductor, both of which occupy a significant amount of area of an SOC die. In addition to the large amount of die area required, conventional fabrication processes for integrating an inductor and a capacitor as part of a voltage regulator on an SOC die may require complicated and expensive process steps, due to different structures and materials used for inductors and capacitors in conventional fabrication processes.

SUMMARY

Examples of the disclosure are directed to integrated circuit devices and methods of making the same. An inductor and a capacitor are provided on a substrate in an integrated circuit device, including, for example, an integrated voltage regulator (IVR) or an embedded voltage regulator (EVR), a radio frequency (RF) circuit, a power amplifier (PA) circuit, a wireless charging circuit, or another type of circuit that includes a combination of one or more capacitors and one or more inductors.

As an example, a device is provided, the device comprising: a substrate having first and second surfaces opposite each other and a plurality of vias through the substrate, the vias comprising a plurality of sidewalls in the substrate; a capacitor on the first surface of the substrate, the capacitor comprising: a first conductive layer; a second conductive layer; and an insulator layer comprising a dielectric material between the first and second conductive layers; and an inductor, comprising: a first magnetic layer disposed on the first surface of the substrate; an insulator layer disposed over the first magnetic layer, the insulator layer of the inductor comprising the same dielectric material as the insulator layer of the capacitor; and a first conductor having at least a first portion disposed over but not in contact with the first magnetic layer and at least a second portion extending over at least one of the sidewalls of at least one of the vias of the substrate.

In another example, an integrated circuit device is provided, the integrated circuit device comprising: a substrate having first and second surfaces opposite each other and a plurality of vias through the substrate, the vias comprising a plurality of sidewalls in the substrate; and a passive circuit, comprising: a capacitor on the first surface of the substrate, the capacitor comprising: a first conductive layer; a second conductive layer; and an insulator layer comprising a dielectric material between the first and second conductive layers; and an inductor, comprising: a first magnetic layer disposed on the first surface of the substrate; an insulator layer disposed on the first magnetic layer, the insulator layer of the inductor comprising the same dielectric material as the insulator layer of the capacitor; and a first conductor having at least a first portion disposed over but not in contact with the first magnetic layer and at least a second portion extending over at least one of the sidewalls of at least one of the vias of the substrate.

In yet another example, a method of making a device is provided, the method comprising: providing a substrate having first and second surfaces opposite each other; forming a plurality of vias through the first and second surfaces of the substrate, wherein forming the plurality of vias includes forming a plurality of sidewalls in the substrate; forming a capacitor on the first surface of the substrate, wherein forming the capacitor comprises forming a first conductive layer, forming an insulator layer comprising a dielectric material on the first conductive layer, and forming a second conductive layer on the insulator layer; forming an inductor core on the first surface of the substrate separated from the capacitor by at least one of the vias, wherein forming the inductor core comprises forming a first magnetic layer, forming an insulator layer on the first magnetic layer, and forming a second magnetic layer on the insulator layer, the insulator layer of the inductor core comprising the same dielectric material as the insulator layer of the capacitor; forming an interlayer dielectric on the inductor core; and forming a coil of an inductor comprising a conductor having a first plurality of portions over the interlayer dielectric of the inductor, a second plurality of portions over the sidewalls of at least some of the vias of the substrate, and a third plurality of portions over the second surface of the substrate.

BRIEF DESCRIPTION OF THE DRAWINGS

The accompanying drawings are presented to aid in the description of examples of the disclosure and are provided solely for illustration of the examples and not limitation thereof.

DETAILED DESCRIPTION

Aspects of the disclosure are described in the following description and related drawings directed to specific examples. Alternate examples may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any example described herein as "exemplary" is not necessarily to be construed as preferred or advantageous over other examples. Likewise, the term "examples" does not require that all examples include the discussed feature, advantage or mode of operation.

The terminology used herein is for the purpose of describing particular examples and is not intended to be limiting of the examples. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Figure 1:
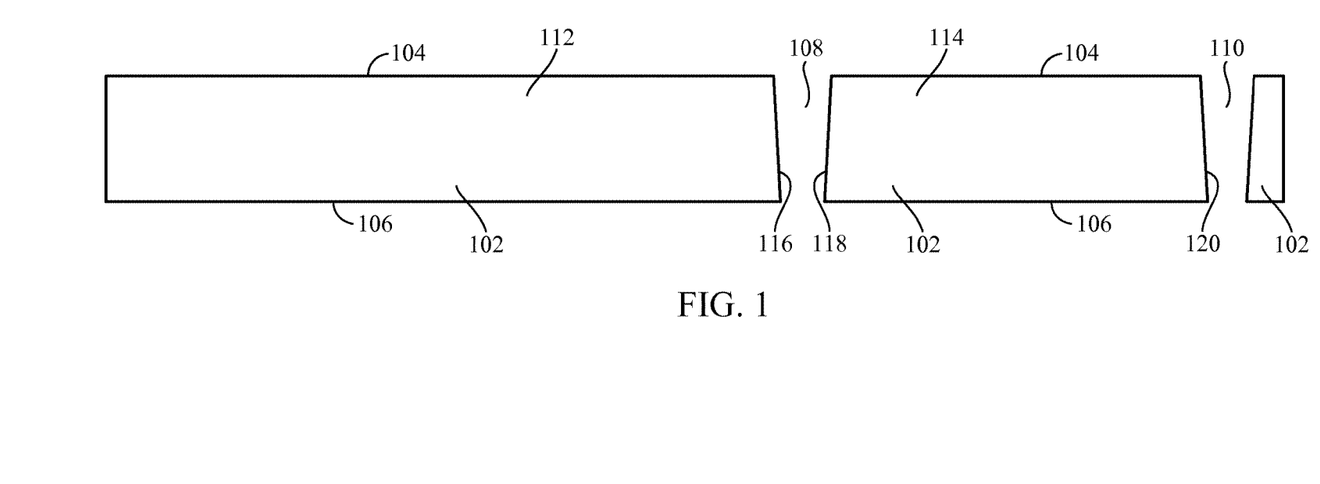
FIG. 1 is a sectional view illustrating an example of a first process in the manufacturing of an example of an integrated circuit device.

FIG. 1 is a sectional view illustrating an example of a first process in the manufacturing of an example of an integrated circuit device. In FIG. 1, a substrate 102 is provided. In some implementations, the substrate 102 may comprise an interposer. In the sectional view illustrated in FIG. 1, the substrate 102 has a first surface 104 and a second surface 106 opposite each other. As an example, the substrate 102 comprises a glass substrate. In alternate examples, the substrate 102 may comprise a silicon substrate, a ceramic substrate, an organic substrate, or another type of substrate or interposer material, for example. Other types of substrates also may be provided within the scope of the disclosure.

Referring to FIG. 1, a plurality of vias 108 and 110 are formed through the first and second surfaces 104 and 106 of the substrate 102. In the sectional view shown in FIG. 1, the via 108 separates the substrate 102 into two separate portions 112 and 114, although the substrate 102 remains a single substrate with through vias such as vias 108 and 110 to allow for metallic connections to provide conductive paths between circuit elements on the first and second surfaces 104 and 106 of the substrate 102.

In the sectional view illustrated in FIG. 1, the first portion 112 of the substrate 102, which has first and second surfaces 104 and 106 as well as a sidewall 116 formed by the first via 108, may be used as the portion on which an integrated capacitor is fabricated. Moreover, in the sectional view illustrated in FIG. 1, the second portion 114 of the substrate 102, which has first and second surfaces 104 and 106 as well as sidewalls 118 and 120 formed by the first and second vias 108 and 110, respectively, may be used as the portion on which an integrated inductor is fabricated. Examples of fabrication processes for an integrated capacitor and an integrated inductor will be described in further detail below with respect to FIGS. 2-10.

Figure 2:
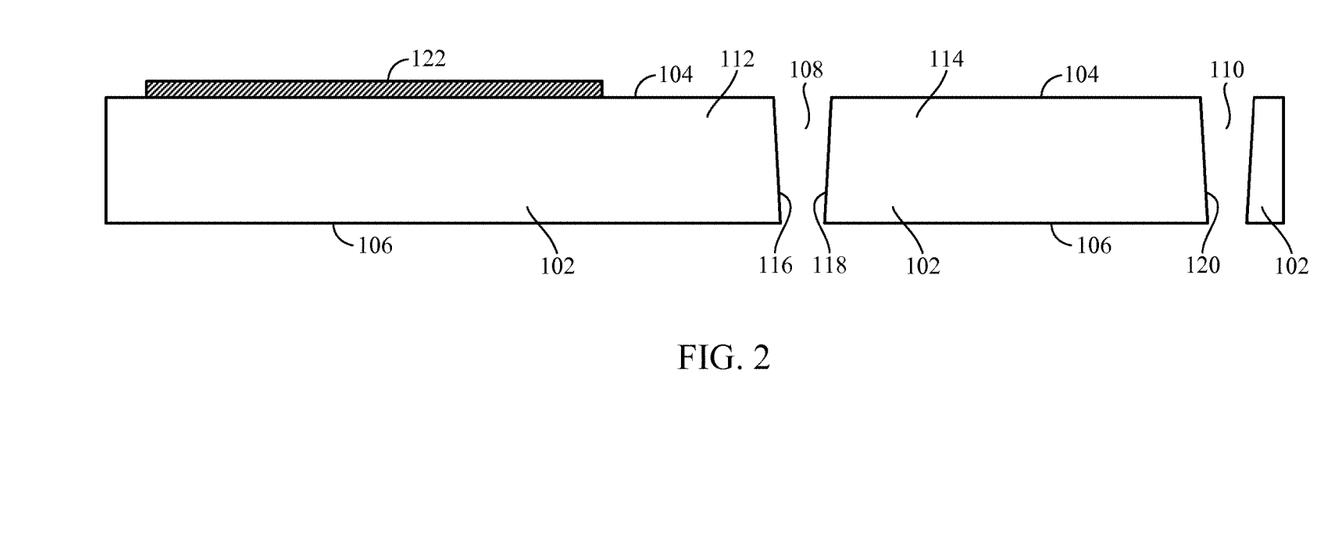
FIG. 2 is a sectional view illustrating an example of a second process in the manufacturing of the example of the integrated circuit device of FIG. 1.

FIG. 2 is a sectional view illustrating an example of a second process in the manufacturing of the example of the integrated circuit device of FIG. 1. In FIG. 2, a first conductor 122 is provided on the first surface 104 of the first portion 112 of the substrate 102. As an example, the first conductor 122 comprises a patterned metal layer. For example, the first conductor 122 may be formed on the first surface 104 of the first portion 112 of the substrate 102 as a patterned copper layer in a manner known to a person skilled in the art.

Figure 3:
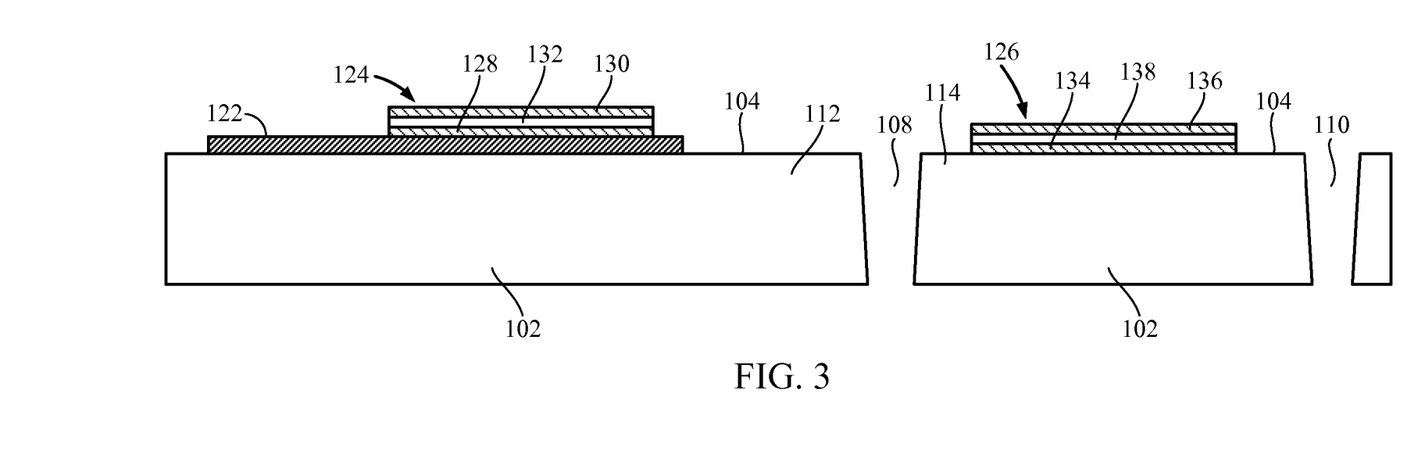
FIG. 3 is a sectional view illustrating an example of a third process in the manufacturing of the example of the integrated circuit device of FIGS. 1-2.

FIG. 3 is a sectional view illustrating an example of a third process in the manufacturing of the example of the integrated circuit device of FIGS. 1-2. In the example illustrated in FIG. 3, a first three-layer structure 124 is provided on the first conductor 122 on the first portion 112 of the substrate 102, whereas a second three-layer structure 126 is provided on the first surface 104 of the second portion 114 of the substrate 102. As an example, the first three-layer structure 124 comprises a first conductive layer 128, a second conductive layer 130, and an insulator 132 sandwiched between the first and second conductive layers 128 and 130. As an example, the three-layer structure 124 is provided on the first portion 112 of the substrate 102 as an integrated metal-insulator-metal capacitor. As an example, the first conductive layer 128 of the first three-layer structure 124 is formed directly on the first conductor 122, the insulator 132 is formed directly on the first conductive layer 128, and the second conductive layer 130 is formed directly on the insulator 132.

As an example, the second three-layer structure 126 comprises a first magnetic layer 134, a second magnetic layer 136, and an insulator layer 138 sandwiched between the first and second magnetic layers 134 and 136. As an example, the three-layer structure 126 is provided on the second portion 114 of the substrate 102 as a magnetic inductor core of an integrated inductor. As an example, the first magnetic layer 134 of the second three-layer structure 126 is formed directly on the first surface 104 of the second portion 114 of the substrate 102, the insulator layer 138 is formed directly on the first magnetic layer 134, and the second magnetic layer 136 is formed directly on the insulator layer 138.

As an example, the first three-layer structure 124 as an integrated capacitor on the first portion 112 of the substrate and the second three-layer structure 126 as a magnetic core of an integrated inductor on the second portion 114 of the substrate 102 may be fabricated simultaneously to reduce the number of process steps. In a further example, the first conductive layer 128 of the first three-layer structure 124 and the first magnetic layer 134 of the second three-layer structure 126 may be formed simultaneously on the first conductor 122 and the first surface 104 of the second portion 114 of the substrate 102, respectively, for example.

As an example, the first conductive layer 128 of the first three-layer structure 124 and the first magnetic layer 134 of the second three-layer structure 126 may comprise the same material, for example, cobalt-tantalum-zirconium (CoTaZr), which is both a magnetic material and a metal alloy capable of serving as a conductor. In a further example, In an alternate example, the first conductive layer 128 of the first three-layer structure 124 need not be made of the same material as the first magnetic layer 134 of the second three-layer structure 126. Alternatively, different types of magnetic materials may be selected for the first magnetic layer 134 depending on the frequency of interest. For example, magnetic materials such as nickel-iron (NiFe), cobalt-iron (CoFe), cobalt-iron-boron (CoFeB), or cobalt-tantalum-zirconium-boron (CoTaZrB) may also be selected for the first magnetic layer 134.

As an example, the insulator layer 132 of the first three-layer structure 124 and the insulator layer 138 of the second three-layer structure 126 may be formed at the same time on the first conductive layer 128 of the first three-layer structure 124 and the first magnetic layer 134 of the second three-layer structure 126, respectively. In a further example, the insulator layer 132 of the first three-layer structure 124 and the insulator layer 138 of the second three-layer structure 126 may comprise the same dielectric material formed at the same time in the fabrication of the first and second three-layer structures 124 and 126, for example. As an example, the dielectric material for both the insulator layer 132 of the first three-layer structure 124 and the insulator layer 138 of the second three-layer structure 126 may comprise silicon dioxide ($SiO_2$), for example. Other types of dielectric materials may also be provided in manners known to persons skilled in the art. For different applications, different types of dielectric materials may be selected depending on the breakdown voltage and the capacitance density. For example, aluminum oxide (AlOx), zirconium oxide (ZrOx) or hafnium oxide (HfOx) may also be used as the dielectric material for the insulator layer 138.

As an example, the second conductive layer 130 of the first three-layer structure 124 and the second magnetic layer 136 of the second three-layer structure 126 may be formed at the same time on the insulator layer 132 of the first three-layer structure 124 and the insulator layer 138 of the second three-layer structure 126, respectively. In a further example, the second conductive layer 130 of the first three-layer structure 124 and the second magnetic layer 136 of the second three-layer structure 126 may comprise the same material, for example, CoTaZr, which is both a magnetic material and a metal alloy capable of serving as a conductor. Alternatively, different types of magnetic materials may be selected for the second magnetic layer 136 as well as the first magnetic layer 134 depending on the frequency of interest. For example, magnetic materials such as nickel-iron (NiFe), cobalt-iron (CoFe), cobalt-iron-boron (CoFeB), or cobalt-tantalum-zirconium-boron (CoTaZrB) may be selected for the second magnetic layer 136.

In an alternate example, the second conductive layer 130 of the first three-layer structure 124 need not be made of the same material as the second magnetic layer 136 of the second three-layer structure 126. In another alternate example, the second magnetic layer 136 may not even need to be provided as part of the second three-layer structure 126, which serves as a magnetic core of an integrated inductor, if the first magnetic layer 134 provides sufficient magnetic flux for the integrated inductor.

Figure 4:
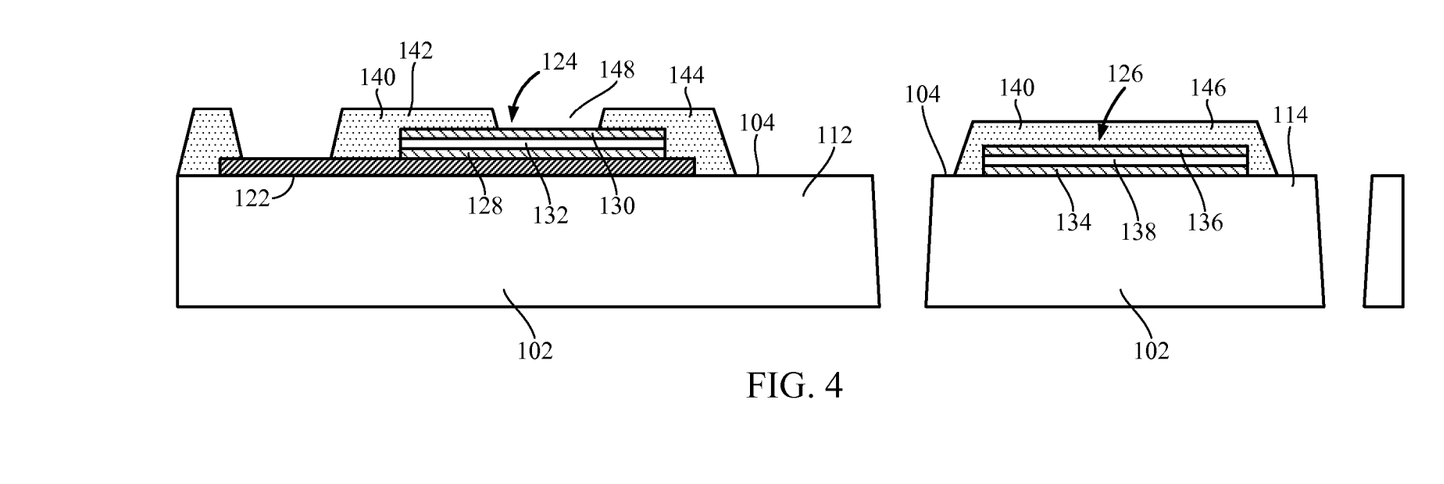
FIG. 4 is a sectional view illustrating an example of a fourth process step in the manufacturing of the example of the integrated circuit device of FIGS. 1-3.

FIG. 4 is a sectional view illustrating an example of a fourth process step in the manufacturing of the example of the integrated circuit device of FIGS. 1-3. As illustrated in FIG. 4, an interlayer dielectric 140 is formed on the first and second portions 112 and 114 of the substrate 102. In the example shown in FIG. 4, the interlayer dielectric 140 includes two separate portions 142 and 144 on the first portion 112 of the substrate 102 for the integrated capacitor and another portion 146 on the second portion 114 of the substrate 102 for the integrated inductor.

In the sectional view illustrated in FIG. 4, the two separate portions 142 and 144 of the interlayer dielectric 140 are positioned to provide a gap 148 which exposes at least a portion of the second conductive layer 130 of the first three-layer structure 124 which serves as an integrated capacitor. As shown in FIG. 4, the first portion 142 of the interlayer dielectric 140 covers a portion of the second conductive layer 130 of the first three-layer structure 124, a portion of the first conductor 122, and a portion of the first surface 104 of the first portion 112 of the substrate 102. Similarly, the second portion 144 of the interlayer dielectric 140 also covers a portion of the second conductive layer 130 of the first three-layer structure 124, a portion of the first conductor 122, and a portion of the first surface 104 of the first portion 112 of the substrate 102.

In the sectional view illustrated in FIG. 4, the portion 146 of the interlayer dielectric 140 is provided as a single dielectric portion over the second magnetic layer 136 of the second three-layer structure 126, which serves as a magnetic core of an integrated inductor. In a further example, the portion 146 of the interlayer dielectric 140 over the second three-layer structure 126 may also cover part of the first surface 104 of the second portion 114 of the substrate 102. As an example, the portions 142, 144 and 146 of the interlayer dielectric 140 may be formed simultaneously for the integrated capacitor and the integrated inductor in a single process step, for example. In an alternate example, the portion 146 of the interlayer dielectric 140 for the integrated inductor and the portions 142 and 144 of the interlayer dielectric 140 for the integrated capacitor may be fabricated in separate process steps, for example.

Figure 5:
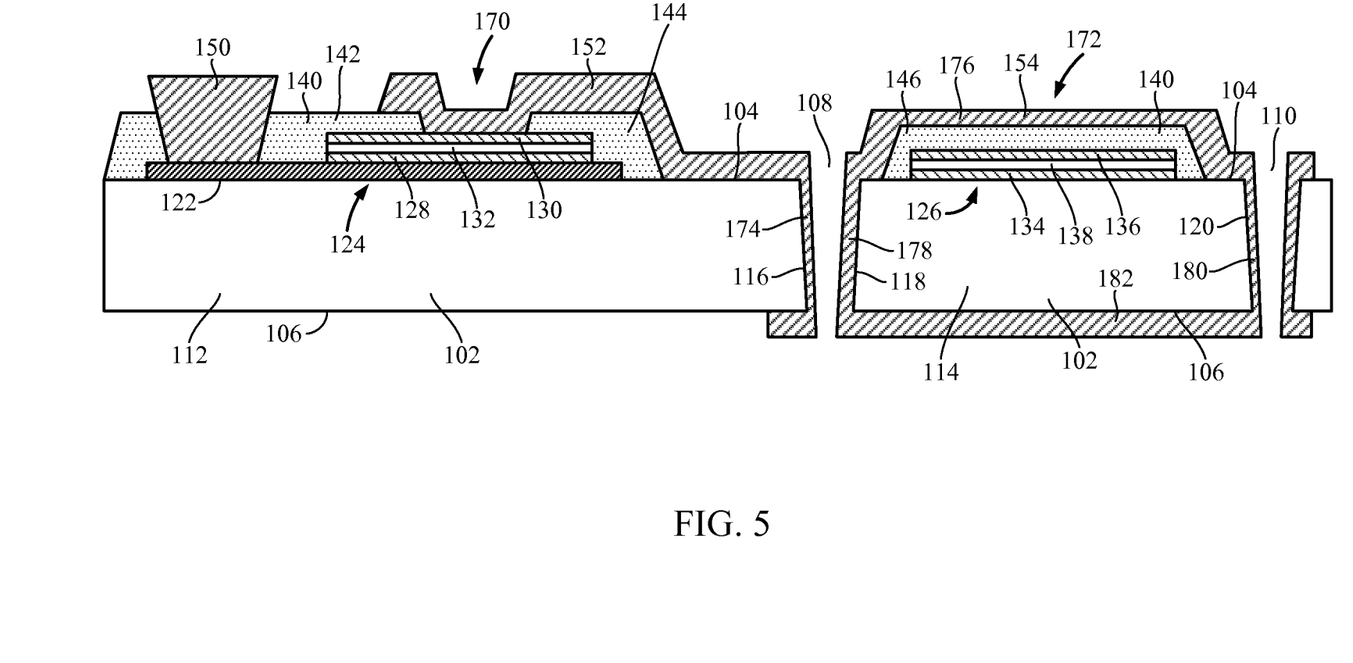
FIG. 5 is a sectional view illustrating an example of a fifth process step in the manufacturing of the example of the integrated circuit device of FIGS. 1-4.

FIG. 5 is a sectional view illustrating an example of a fifth process step in the manufacturing of the example of the integrated circuit device of FIGS. 1-4. In FIG. 5, a plurality of conductors 150 and 152 are provided over the first portion 112 of the substrate 102 to form an integrated capacitor 170, and a conductor 154 is provided over the second portion 114 of the substrate 102 to form an integrated inductor 172. As an example, the conductors 150, 152 and 154 comprise plated conductors. For example, the conductors 150, 152 and 154 may comprise copper plating. In alternate examples, other types of conductors may also be implemented.

In the example illustrated in FIG. 5, the conductor 150 is in direct contact with the first conductor 122, which is in direct contact with the first conductive layer 128 of the first three-layer structure 124 of the integrated capacitor 170, thus providing a conductive path for the first conductive layer 128. As an example, the conductor 152 is in direct contact with the second conductive layer 130 of the first three-layer structure 124 of the integrated capacitor 170, thus providing a conductive path for the second conductive layer 130. In a further example, the conductor 152 also has an extended portion 174 that extends over the sidewall 116 of the first via 108. In an alternate example, the conductor 152 need not have an extended portion over the sidewall 116 of the first via 108.

In the example illustrated in FIG. 5, the interlayer dielectric 140 has a portion 142 which is positioned over a portion of the first three-layer structure 124 and a portion of the first conductor 122 to separate the conductor 150 from the conductor 152. In this configuration, the portion 142 of the interlayer dielectric 140 provides electrical insulation between the conductors 150 and 152, thus avoid a short circuit between the two conductive layers 128 and 130 of the first three-layer structure 124 of the integrated capacitor 170. In alternate examples, other configurations may also be implemented for providing separate conductive paths for the conductive layers 128 and 130 for the integrated capacitor 170 while avoiding a short circuit between the two conductive layers 128 and 130.

In the example illustrated in FIG. 5, the conductor 154 has a top portion 176 over the portion 146 of the interlayer dielectric 140, which is positioned over the second three-layer structure 126 serving as a magnetic core, side portions 178 and 180 extending over sidewalls 118 and 120 of the first and second vias 108 and 110, respectively, and a bottom portion 182 under the second surface 106 of the second portion 114 of the substrate 102. As shown in FIG. 5, the conductor 154 is not in direct contact with the second three-layer structure 126 which serves as a magnetic core. In the sectional view of FIG. 5, the conductor 154, which comprises the top portion 176, the side portions 178 and 180, and the bottom portion 182, may be regarded as the sectional view of one loop of an inductor coil which comprises a plurality of loops. An example of an integrated inductor having a coil with multiple loops will be described in further detail below with respect to the perspective views shown in FIGS. 6 and 7.

As an example, the top conductor 152 for the capacitor 170 and the top conductor 154 for the inductor 172 are formed as a metal layer formed by thick redistribution layer (RDL) seeding, plating and stripping after patterning of the interlayer dielectric 140. As an example, the thickness of the metal layer of the top conductor 152 for the capacitor 170 and the top conductor 154 for the inductor 172 is in the range of about 15 μm to about 20 μm. As an example, the capacitor 170 and the inductor 172 may be fabricated in the same fabrication sequence as part of an integrated circuit device.

Figure 6:
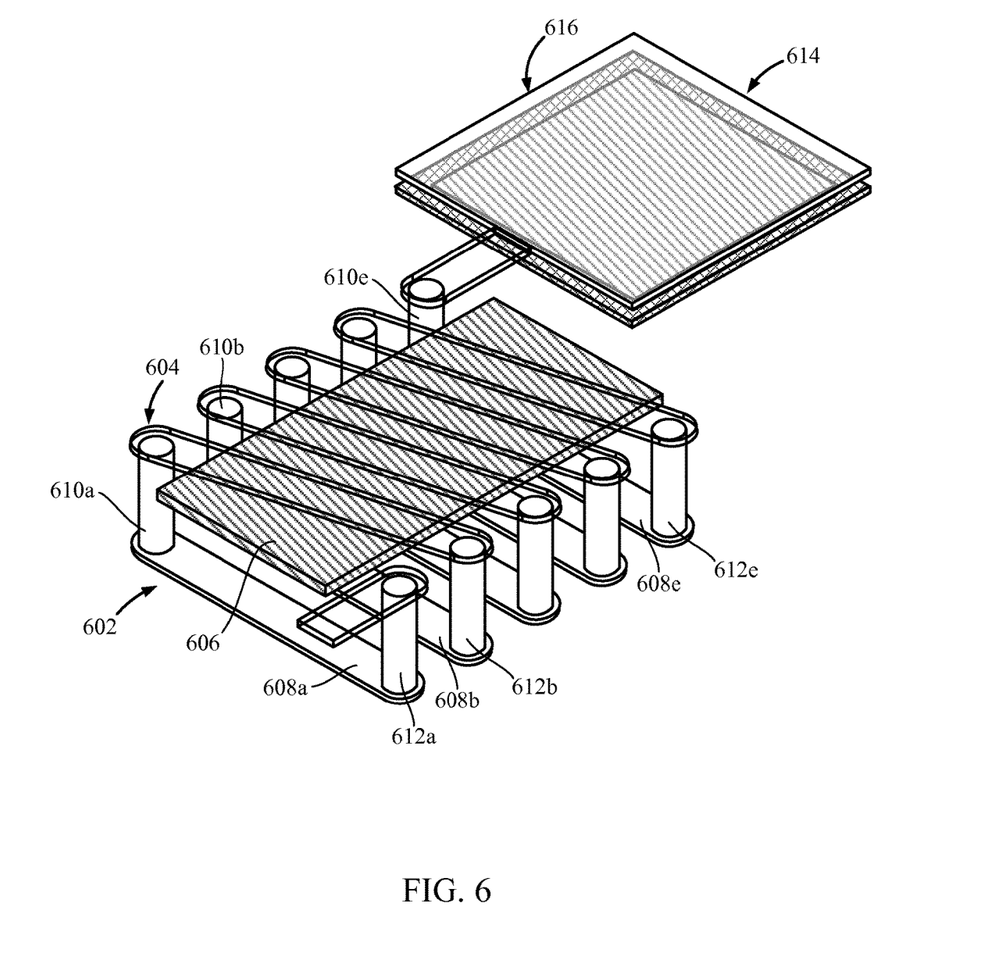
FIG. 6 is a perspective view of an example of an integrated circuit device before top metal plating is provided to form top portions of a coil of a solenoid inductor and a top conductive portion of a capacitor.

FIG. 6 is a perspective view of an example of an integrated circuit device before top metal plating is provided to form top portions of a coil of an integrated solenoid inductor and a top conductive portion of an integrated capacitor. In FIG. 6, an integrated solenoid inductor 602 comprises a coil 604 which has multiple loops around a magnetic core 606. As an example, the magnetic core 606 comprises a three-layer structure such as the second three-layer structure 126 illustrated in the sectional views of FIGS. 3-5 and described above. As an example, the magnetic core 606 comprises two layers of magnetic films, such as first and second magnetic layers 134 and 136 in the second three-layer structure 126 as shown in FIGS. 3-5, and an insulator layer 138 sandwiched between the first and second magnetic layers 134 and 136. Alternatively, a single layer of magnetic film may be provided for the magnetic core 606. In other examples, more than two layers of magnetic films may be provided for the magnetic core 606.

Referring to FIG. 6, the coil 604 of the solenoid inductor 602 comprises a plurality of bottom conductive portions 608a, 608b, ... 608e, a first plurality of vertical conductive portions 610a, 601b, ... 610e, a second plurality of vertical conductive portions 612a, 612b, ... 612e. As an example, the bottom conductive portions 608a, 608b, ... 608e are formed on the bottom surface of a substrate. For the purpose of clear illustration, the substrate, which may be a glass substrate, or alternatively, a silicon substrate, a ceramic substrate, or an organic substrate, is not shown in the perspective view of FIG. 6. As an example, each of the bottom conductive portions 608a, 608b, ... 608e in FIG. 6 may have a sectional view similar to the bottom portion 182 of the conductor 154 on the second surface 106 of the second portion of the substrate 102 as illustrated in FIG. 5.

Referring to FIG. 6, the first plurality of vertical conductive portions 610a, 601b, ... 610e and the second plurality of vertical conductive portions 612a, 612b, ... 612e may be formed on respective sidewalls of vias through the substrate. As an example, each of the first plurality of vertical conductive portions 610a, 610b, ... 610e may be formed as a conductive side portion such as the side portion 178 of the conductor 154 on the sidewall 118 of the first via 108 with a sectional view similar to the one shown in FIG. 5, for example. Likewise, each of the second plurality of vertical conductive portions 612a, 612b, ... 612e may be formed as a conductive side portion such as the side portion 180 of the conductor 154 on the sidewall 120 of the second via 110 with a sectional view similar to the one shown in FIG. 5, for example.

Referring to FIG. 6, the integrated circuit device also includes an integrated capacitor 614, which, as an example, includes the first three-layer structure 124 as illustrated in the sectional views of FIGS. 3-5 described above. The detailed structure of the integrated capacitor 614 is not shown in the perspective view of FIG. 6 for the purpose of clear and simplified illustration. As an example, the integrated capacitor 614 is disposed on the same substrate with through vias on which the integrated inductor 602 is implemented. FIG. 6, which is a perspective view of an example of the integrated circuit device before top metal plating is provided to form top portions of the coil of the integrated inductor and the top conductive portion of the integrated capacitor, shows traces of a pattern 616 for which the top metal plating will be formed.

Figure 7:
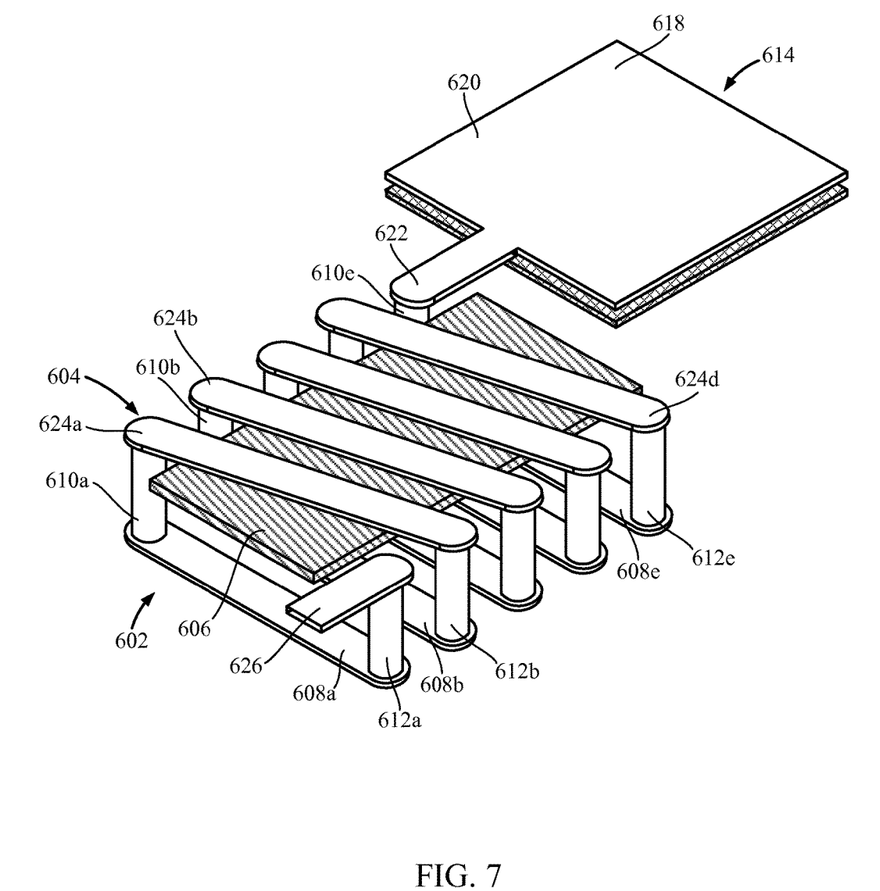
FIG. 7 is a perspective view of the example of the integrated circuit device of FIG. 6 after top metal plating is provided to form top portions of the coil of the solenoid inductor and the top conductive portion of the capacitor.

FIG. 7 is a perspective view of the example of the integrated circuit device of FIG. 6 after top metal plating is provided to form top portions of the coil of the integrated solenoid inductor and the top conductive portion of the integrated capacitor. In FIG. 7, a top metal plate 618 is formed to provide a conductive path between one of the conductive layers of the integrated capacitor 614 and one of the terminals of the integrated solenoid inductor 602, as well as top conductive portions of the coil 604 for the integrated solenoid inductor 602.

In the example illustrated in FIG. 7, the top metal plate 618 includes a capacitor portion 620, a conductive path 622 which connects the integrated capacitor 614 with the integrated solenoid inductor 602, and top inductor portions 624a, 624b, ... 624d which serve as the top conductive portions of the coil 604 for the integrated solenoid inductor 602. As an example, the conductive path 622 is connected to the vertical conductive portion 610e, which serves as a terminal of the integrated solenoid inductor 602, for a direct electrical connection with one of the conductive layers of the integrated capacitor 614.

As an example, the top metal plate 618 may also include a conductive portion 626 which provides a conductive path for the vertical conductive portion 612a, which serves as another terminal of the integrated solenoid inductor 602 opposite the vertical conductive portion 610e, which serves as the terminal to which the conductive path 622 is connected. As an example, each of the top inductor portions 624a, 624b, ... 624d of the top metal plate 618 may have a sectional view similar to the top portion 176 of the conductor 154 as illustrated in FIG. 5 and described above. As an example, the capacitor portion 620 of the top metal plate 618 also may have a sectional view similar to the conductor 152 as illustrated in FIG. 5 and described above. Although the conductor 152 over the first three-layer structure 124 for the integrated capacitor 170 as illustrated in the sectional view of FIG. 5 does not have a flat top surface, it may have a flat top surface over some or all portions of the integrated capacitor 170 in a different example.

Figure 8:
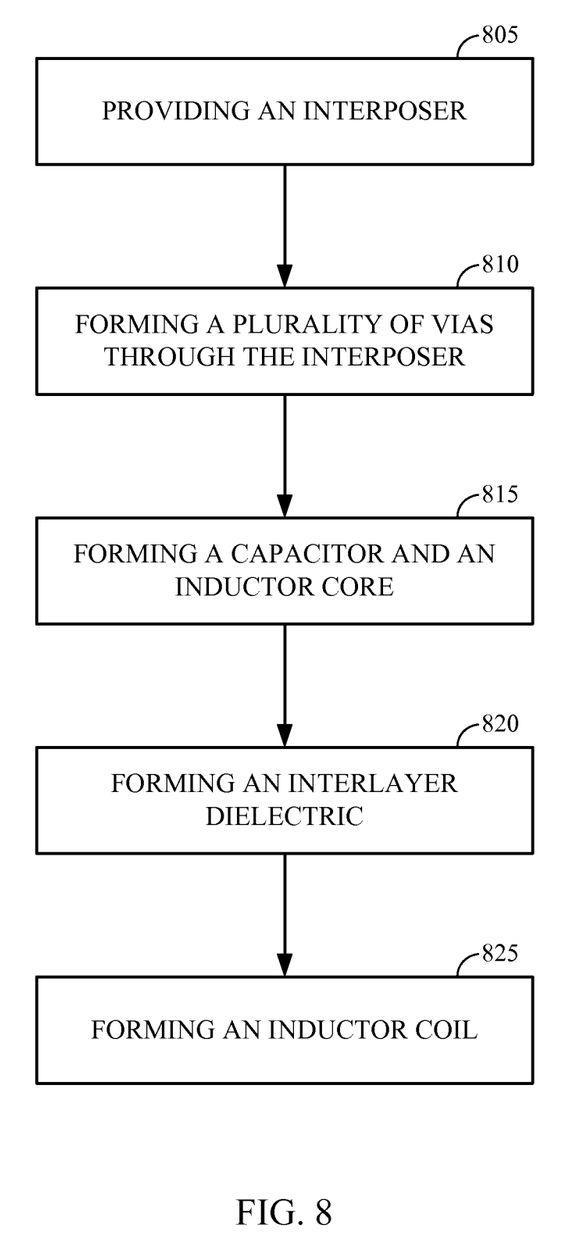
FIG. 8 is a flowchart illustrating an example of a method of making an integrated circuit device.

FIG. 8 is a simplified flowchart illustrating an example of a method of making an integrated circuit device. In FIG. 8, a substrate is provided in block 805. In block 810, a plurality of vias are formed through the substrate. In block 815, a capacitor and an inductor core are formed. Examples of forming the capacitor and the inductor core are described above with respect to FIGS. 3-5. Referring to FIG. 8, an interlayer dielectric is formed in block 820. Portions of the interlayer dielectric may be patterned and formed on the integrated capacitor and on the inductor core of the integrated inductor according to examples described above with respect to FIGS. 4-5. Referring to FIG. 8, an inductor coil is formed in block 825. Examples of forming an inductor coil of an integrated solenoid inductor are described above with respect to the sectional view illustrated in FIG. 5 and the perspective views illustrated in FIGS. 6-7.

In the examples described above, a capacitor and an inductor can be formed as part of an integrated circuit device during the same fabrication process, thereby reducing the cost of manufacturing. The capacitor and the inductor can be formed in the same fabrication process because the metal-insulator-metal structure for the capacitor is on the same die instead of separate dies as formed in conventional processes. Moreover, a smaller form factor can be achieved because the capacitor and the inductor are integrated onto a single substrate as described above.

The integrated capacitor and inductor (passives) on a substrate manufactured during the same fabrication process may be integrated in various types of integrated circuit devices for various applications. The integrated passives, an example of which is shown in FIG. 7 and described above, may be implemented in an integrated voltage regulator for voltage regulation, or in other types of integrated circuits for other types of applications, including but not limited to radio frequency (RF) modules, power amplifier (PA) modules, or wireless charging modules, for example. In these examples, integrated passives allow the foot print and size of the modules to be reduced. The use of the same type of laminated multi-layer magnetic film to boost the inductance of the inductor and as the metal-insulator-metal capacitor allows simultaneous fabrication of the inductor and the capacitor, thereby reducing the cost of manufacturing. Furthermore, although the example of single inductor and a single capacitor is illustrated in FIGS. 1-7 and described above, the foregoing disclosure is also applicable to multiple inductors and/or multiple capacitors arranged in series, in parallel, or in any combination thereof, to form a passive integrated circuit as required by circuit design.

While the foregoing disclosure shows illustrative examples, it should be noted that various changes and modifications could be made herein without departing from the scope of the appended claims. The functions, steps or actions of the method claims in accordance with examples described herein need not be performed in any particular order unless expressly stated otherwise. Furthermore, although elements may be described or claimed in the singular, the plural is contemplated unless limitation to the singular is explicitly stated.

What is claimed is:

1. A device, comprising:
    a substrate comprising first and second surfaces opposite each other and a plurality of vias through the substrate, the vias comprising a plurality of sidewalls in the substrate;
    a third conductor on the first surface of the substrate;
    a capacitor on the third conductor, the capacitor comprising:
        a first conductive layer;
        a second conductive layer; and
        an insulator layer comprising a dielectric material between the first and second conductive layers; and
    an inductor, comprising a magnetic core, the magnetic core comprising:
        a first magnetic layer disposed on the first surface of the substrate; and
        an insulator layer disposed over the first magnetic layer, the insulator layer of the inductor comprising the same dielectric material as the insulator layer of the capacitor,
        wherein the capacitor and the magnetic core of the inductor are fabricated simultaneously; and
    a first conductor comprising at least a first conductor portion disposed over but not in contact with the first magnetic layer and at least a second conductor portion extending over at least one of the sidewalls of at least one of the vias of the substrate.

2. The device of claim 1, further comprising a conductive path between the capacitor and the inductor.

3. The device of claim 1, wherein the inductor further comprises a second magnetic layer disposed over the insulator layer of the inductor.

4. The device of claim 3, wherein the second magnetic layer of the inductor and the second conductive layer of the capacitor are fabricated in the same process.

5. The device of claim 3, wherein the inductor further comprises an interlayer dielectric between the first conductor and the second magnetic layer.

6. The device of claim 5, wherein the first conductor of the inductor comprises a plurality of first portions over the interlayer dielectric, a plurality of second portions over the sidewalls of at least some of the vias of the substrate, and a plurality of third portions under the second surface of the substrate, the pluralities of first, second and third portions of the first conductor forming a coil of the inductor.

7. The device of claim 1, wherein the dielectric material of the insulator layer of the capacitor and the insulator layer of the inductor comprises silicon oxide ($SiO_2$).

8. The device of claim 1, wherein the first conductor of the inductor comprises copper plating.

9. The device of claim 1, wherein the capacitor further comprises:
    a second conductor coupled to the first conductive layer, the second conductor comprising at least one portion extending over at least one of the sidewalls of at least one of the vias of the substrate; and
    the third conductor coupled to the second conductive layer.

10. The device of claim 9, wherein the second and third conductors of the capacitor comprise copper plating.

11. The device of claim 9, wherein the capacitor further comprises an interlayer dielectric positioned to provide electrical insulation between the second and third conductors of the capacitor.

12. The device of claim 1, wherein the substrate comprises at least one of a glass substrate, a silicon substrate, a ceramic substrate, and an organic substrate.

13. An integrated circuit device, comprising:
a substrate comprising first and second surfaces opposite each other and a plurality of vias through the substrate, the vias comprising a plurality of sidewalls in the substrate;
a third conductor on the first surface of the substrate; and
a passive circuit, comprising:
   a capacitor on the third conductor, the capacitor comprising:
      a first conductive layer;
      a second conductive layer; and
      an insulator layer comprising a dielectric material between the first and second conductive layers; and
   an inductor, comprising a magnetic core, the magnetic core comprising:
      a first magnetic layer disposed on the first surface of the substrate;
      an insulator layer disposed on the first magnetic layer, the insulator layer of the inductor comprising the same dielectric material as the insulator layer of the capacitor,
      wherein the capacitor and the magnetic core of the inductor are fabricated simultaneously; and
   a first conductor comprising at least a first conductor portion disposed over but not in contact with the first magnetic layer and at least a second conductor portion extending over at least one of the sidewalls of at least one of the vias of the substrate.

14. The integrated circuit device of claim 13, wherein the inductor further comprises a second magnetic layer disposed on the insulator layer of the inductor.

15. The integrated circuit device of claim 14, wherein the inductor further comprises an interlayer dielectric between the first conductor and the second magnetic layer.

16. The integrated circuit device of claim 15, wherein the first conductor of the inductor comprises a plurality of first portions over the interlayer dielectric, a plurality of second portions over the sidewalls of at least some of the vias of the substrate, and a plurality of third portions under the second surface of the substrate, the pluralities of first, second and third portions of the first conductor forming a coil of the inductor.

17. The integrated circuit device of claim 13, wherein the capacitor further comprises:
a second conductor coupled to the first conductive layer, the second conductor comprising at least one portion extending over at least one of the sidewalls of at least one of the vias of the substrate;
the third conductor coupled to the second conductive layer; and
an interlayer dielectric positioned to provide electrical insulation between the second and third conductors of the capacitor.

18. The integrated circuit device of claim 13, wherein the passive circuit comprises a circuit selecting from the group consisting of a voltage regulator, a power amplifier, a radio frequency circuit, and a wireless charging circuit.

* * * * *